(12) United States Patent
Yoshitake et al.

(10) Patent No.: US 6,900,473 B2
(45) Date of Patent: May 31, 2005

(54) SURFACE-EMITTING SEMICONDUCTOR LIGHT DEVICE

(75) Inventors: Shunji Yoshitake, Kawasaki (JP);
Hideki Sekiguchi, Yokohama (JP);
Atsuko Yamashita, Yokosuka (JP);
Kazuhiro Takimoto, Toyoura-gun (JP);
Koichi Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 10/178,714

(22) Filed: Jun. 25, 2002

(65) Prior Publication Data
US 2002/0195609 A1 Dec. 26, 2002

(30) Foreign Application Priority Data

Jun. 25, 2001 (JP) .......................................... 2001-191724
Sep. 27, 2001 (JP) .......................................... 2001-297042

(51) Int. Cl.[7] .............................................. H01L 33/00
(52) U.S. Cl. ............................. 257/95; 257/81; 257/98; 257/99; 257/100; 257/103
(58) Field of Search ............................. 257/81, 95, 98, 257/99, 100, 103, 46

(56) References Cited

U.S. PATENT DOCUMENTS

| 4,225,380 A | | 9/1980 | Wickens |
| 5,132,751 A | | 7/1992 | Shibata et al. |
| 5,779,924 A | * | 7/1998 | Krames et al. ............... 216/24 |
| 5,898,192 A | | 4/1999 | Gerner |
| 6,091,085 A | | 7/2000 | Lester |
| 6,151,169 A | * | 11/2000 | Kim ............................ 359/640 |
| 6,395,572 B1 | * | 5/2002 | Tsutsui et al. ................ 438/46 |
| 6,469,324 B1 | * | 10/2002 | Wang ........................... 257/98 |

FOREIGN PATENT DOCUMENTS

| EP | 0 404 565 | 12/1990 |
| JP | 63-283174 | 11/1988 |
| JP | 7-183575 | 7/1995 |
| JP | 11-204840 | 7/1999 |
| WO | WO 01/18883 A1 | 9/2000 |
| WO | WO 01/24280 A1 | 9/2000 |

OTHER PUBLICATIONS

Reiner Windisch et al., "40% Efficient Thin–Film Surface–Textured Light–Emitting Diodes by Optimization of Natural Lithography", IEEE Transactions on Electron Devices, vol. 47, No. 7, Jul. 2000, pp. 1492–1498.
European Search Report.

* cited by examiner

*Primary Examiner*—Minhloan Tran
*Assistant Examiner*—Tan Tran
(74) *Attorney, Agent, or Firm*—Oblon, Spivak, McClelland, Maier & Neustadt, P.C.

(57) ABSTRACT

A semiconductor light emitting device is disclosed in which a semiconductor multilayer structure including a light emitting layer is formed on a substrate and light is output from the opposite surface of the semiconductor multilayer structure from the substrate. The light output surface is formed with a large number of protrusions in the form of cones or pyramids. To increase the light output efficiency, the angle between the side of each protrusion and the light output surface is set to between 30 and 70 degrees.

21 Claims, 9 Drawing Sheets

SURFACE-EMITTING SEMICONDUCTOR LIGHT DEVICE

CROSS-REFERENCE TO RELATED APPLICATIONS

This application is based upon and claims the benefit of priority from the prior Japanese Patent Applications No. 2001-191724, filed Jun. 25, 2001; and No. 2001-297042, filed Sep. 27, 2001, the entire contents of both of which are incorporated herein by reference.

BACKGROUND OF THE INVENTION

1. Field of the Invention

The present invention relates to a semiconductor light emitting diode, such as a light emitting diode (LED) or a laser diode (LD). More specifically, the present invention relates to a semiconductor light emitting device having its light output surface made rough.

2. Description of the Related Art

Conventionally, a high intensity LED has been fabricated by forming a double-heterostructure light emitting region on a semiconductor substrate and then forming a current diffusing layer on the light emitting region. For this reason, packaging the high intensity LED with a resin results in a structure in which the top of the current diffusing layer is covered with the passivating transparent resin.

With such a structure, the critical angle associated with the current diffusing layer (the refractive index is in the range of 3.1 to 3.5) and the vitreous resin (the refractive index is of the order of 1.5) is in the range of 25 to 29 degrees. Of light that travels from the light emitting region toward the vitreous resin, the light that strikes the layer—resin interface at angles larger than the critical angle will suffer total internal reflections. This will significantly reduce the probability of light produced within the LED being emitted to the outside. At present, the probability (light output efficiency) is of the order of 20%.

There is a method of improving the light output efficiency by forming a film of high refractive index on the current diffusing layer to thereby increase the critical angle. However, even with this method, an increase in the efficiency is low, of the order of 20%.

Thus, the conventional LEDs that are packaged with transparent resin material suffer from the problem that the light output efficiency is low. This is because, at the interface between the transparent resin and the top layer of semiconductor multi-layer structure including a light emitting layer, most of the light that strikes the interface at angles suffers total internal reflections. This problem is common to surface-emitting LDs.

BRIEF SUMMARY OF THE INVENTION

According to an aspect of the present invention, there is provided a surface-emitting semiconductor light emitting device comprising; a substrate having a major surface; a semiconductor multilayer structure formed on the major surface of the substrate and including a light emitting layer, emitted light being output from the opposite surface of the multilayer structure from the substrate; and a plurality of protrusions formed on the light output surface of the semiconductor multilayer structure, the angle between the base and side of each protrusion being set to between 30 and 70 degrees.

According to another aspect of the present invention, there is provided a surface-emitting semiconductor light emitting device comprising: a substrate having a major surface; and a semiconductor multilayer structure formed on the major surface of the substrate and including a light emitting layer, light being output from the opposite surface of the semiconductor multilayer structure and the light output surface having been subjected to a roughening process so that a large number of protrusions and recesses is formed thereon, the distance between the peak and valley of each protrusion and recess being set to between 50 nm and the wavelength of light emitted by the light emitting layer.

DETAILED DESCRIPTION OF THE INVENTION

The preferred embodiments of the present invention will be described with reference to the accompanying drawings.

Figure 1A:
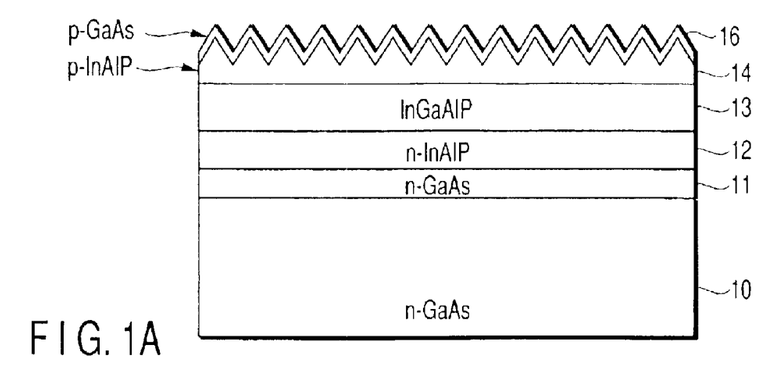
FIGS. 1A, 1B and 1C are cross-sectional views, in the order of steps of manufacture, of a green LED according to a first embodiment of the present invention.
Figure 1B:
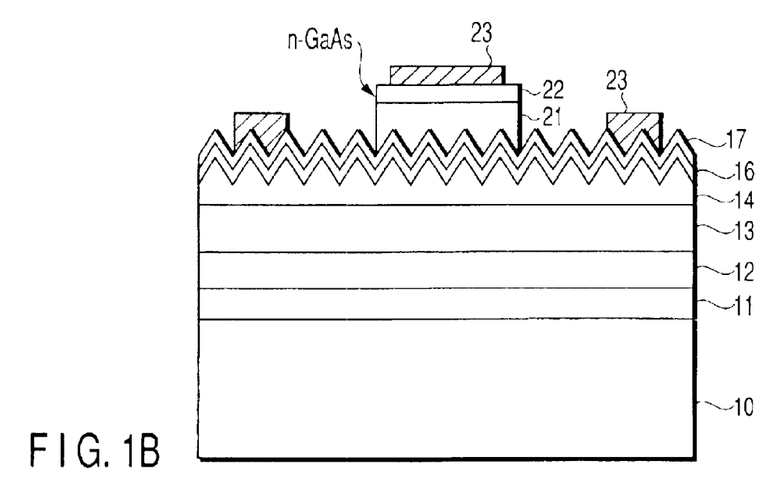
Figure 1C:
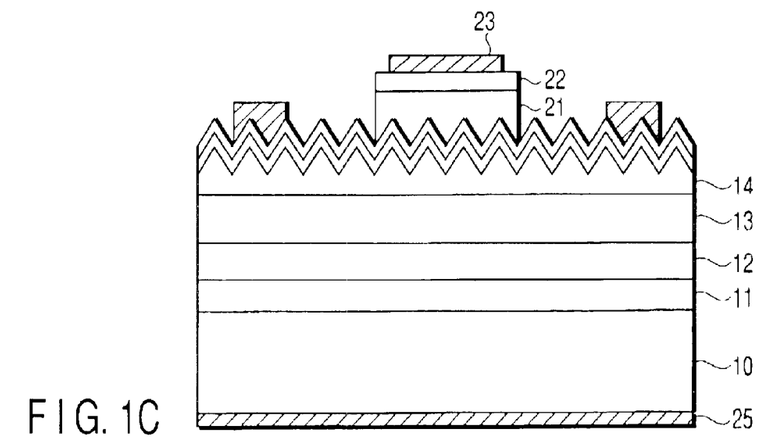

FIGS. 1A, 1B and 1C are cross-sectional views, in the order of steps of manufacture, of a green LED according to a first embodiment of the present invention.

First, as shown in FIG. 1A, onto an n-type GaAs substrate 10 of 250 μm in thickness, an n-type GaAs buffer layer 11 of 0.5 μm in thickness is grown by means of metal-organic CVD (MOCVD) using $AsH_3$ as a group V element source gas. After that, by means of MOCVD using $PH_3$ as a group V element source gas and under conditions of a $PH_3$ partial pressure of 200 Pa and a total pressure of $5 \times 10^3$ Pa, an n-type $In_{0.5}Al_{0.5}P$ cladding layer 12 of 0.6 μm in thickness and an undoped $In_{0.5}(Ga_{0.55}Al_{0.45})_{0.5}P$ active layer 13 of 1.0 μm in thickness are grown in sequence.

Subsequently, a p-type $In_{0.5}Al_{0.5}P$ cladding layer 14 of 1.0 μm in thickness is grown by means of MOCVD with the $PH_3$ partial pressure reduced to 10 Pa and the total pressure kept at $5 \times 10^3$ Pa. After that, a p-type GaAs contact layer 16 of 0.1 μm in thickness is grown by means of MOCVD using $AsH_3$ as a group V element source gas. Each of the epitaxial layers from the buffer layer 11 to the contact layer 16 is grown in succession in the same chamber.

Figure 2:
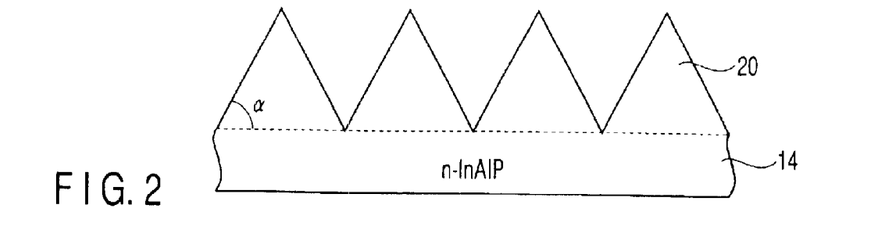
FIG. 2 is an enlarged cross-sectional view of protrusions formed on the light output surface of the LED of FIG. 1.

As described above, in growing the p-type InAlP cladding layer 14, when the $PH_3$ partial pressure in the MOCVD process is reduced to a sufficiently low pressure (not higher than 20 Pa), the surface of the epitaxial layer becomes roughened. To be specific, conical protrusions 20 are produced on the surface of the InAlP cladding layer 14 as shown in FIG. 2. The angle of each protrusion with respect to the substrate surface, i.e., the angle α made by the base and the side of each protrusion, becomes larger than 30 degrees.

Here, if, when the InAlP cladding layer 14 is being grown, the $PH_3$ partial pressure is in excess of 20 Pa, the surface of the cladding layer would become less roughened, increasing the possibility that each protrusion may fail to attain more than 30 degrees in the angle α made by its base and side. If, on the other hand, the $PH_3$ partial pressure is lower than 1 Pa, then the surface of the cladding layer 14 would become too much roughened and moreover its crystallinity would also become degraded. Therefore, the $PH_3$ partial pressure at the growth of the InAlP cladding layer 14 should preferably be in the range of 1 to 20 Pa.

Next, as shown in FIG. 1B, an ITO (Indium Thin Oxide) film 17 serving as a transparent electrode is formed on a selected portion of the GaAs contact layer 16 through sputtering techniques. Subsequently, a p-side electrode (Zn-containing Au) 23 is formed on the ITO film 17. More specifically, a current block layer 21 and a GaAs layer 22 are grown on the ITO film 17 and then selectively etched so that they are left in the central area of the chip. Subsequent to this process, the AuZn electrode 23 is formed over the entire surface and then patterned so that it is left on the GaAs film 22 and selected portions of the ITO film 17.

Figure 3:
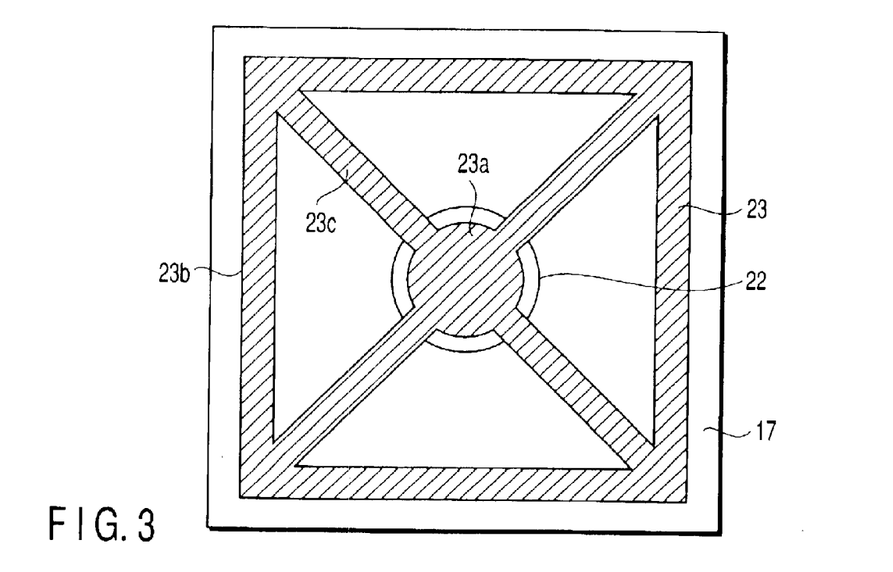
FIG. 3 is a plan view of an electrode pattern of the LED of FIG. 1.

FIG. 3 is a plan view illustrating a pattern of the p-side electrode 23. This electrode pattern is comprised of a circular pad 23a provided in the central area of the device so that a wire may be bonded, peripheral portions 23 provided along the edges of the device, and contact portions 23c that connect the peripheral portions 23b to the central pad 23a.

Next, as shown in FIG. 1C, the GaAs substrate 10 has its rear side polished to a thickness as small as 100 μm and then formed underneath with an n-side electrode (Ge-containing Au) 25. After that, the resulting structure is subjected to a heat treatment in an Ar atmosphere at 450° C. for 15 minutes. Subsequently, the substrate 10, formed with the layers 11, 12, 13, 14, 16, 17, 21 and 22 and the electrodes 23 and 25, is scribed to obtain chips. Each individual chip is then housed in a resin package so that its light output surface is covered with a transparent resin not shown.

A single chip structure is illustrated in FIG. 1; however, in practice a plurality of chip structures as shown in FIG. 1 is formed on the same substrate 10 in order to form a plurality of chips at the same time. By scribing the substrate 10 at the final stage, it is separated into chips.

According to the present embodiment, as described above, the conical protrusions 20 can be formed on the surface of the cladding layer 14 by setting the $PH_3$ partial pressure lower than usual when the p-type InAlP cladding layer 14 is grown. The formation of the protrusions 20 allows the probability of incident light suffering total internal reflections at the interface between the topmost layer of the multi-layer structure including the light emitting layer and the transparent resin to be reduced. In particular, by setting the InAlP cladding layer growth time $PH_3$ partial pressure to between 1 and 20 Pa, the angle a made by the base and the side of each protrusion can be set to 30 degrees or more.

Figure 4:
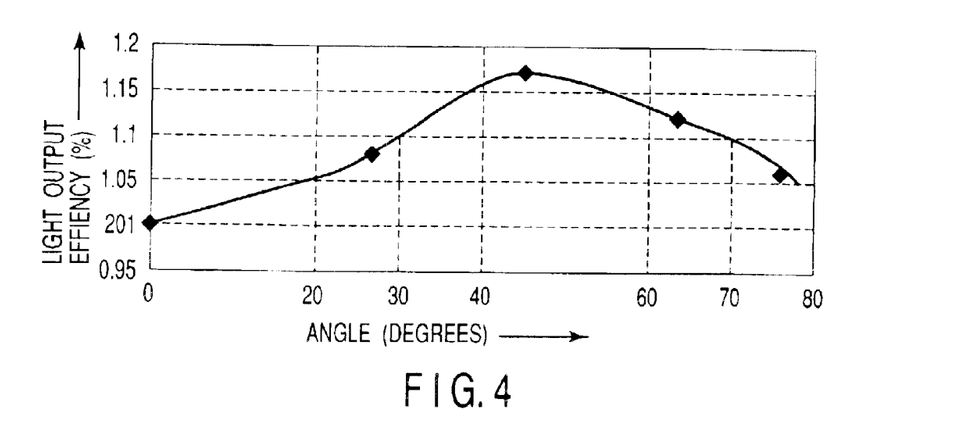
FIG. 4 is a plot of the angle between the side of the protrusion and the substrate surface versus the light output efficiency of the LED of FIG. 1.

Here, a relationship between the incidence-on-resin probability (light output efficiency) and the angle of the protrusions 20 with respect to the substrate surface is shown in FIG. 4. In this figure, the angle is shown on the horizontal axis and the light output efficiency is shown on the vertical axis. The light output efficiency when the surface is free of protrusions and hence flat is taken to be unity. An improvement of more than ten percent was recognized when the angle α was 30 degrees or more. Conversely, when the angle α was too large, a reduction in the efficiency was recognized. With angles in excess of 70 degrees, the efficiency fell below ten percent. Thus, the angle α should preferably range from 30 to 70 degrees.

The adoption of the protrusion structure as in this embodiment allows the light output efficiency to be increased by a factor of 1.15 in comparison with the conventional device without protrusions. That the light output efficiency can be increased without changing the basic device structure is extremely advantageous to LEDs.

Even though the angle α should be set to 30 degrees or more, all the protrusions need not necessarily meet this requirement. Most of the protrusions (for example, more than 90 percent) have only to meet the requirement. Even if each protrusion is formed so as to have an angle α in the range of 30 to 70 degrees, some of the resulting protrusions may have an angle of less than 30 degrees and some of them may have an angle of more than 70 degrees. There will arise no problem if the percentage of protrusions that have angles outside the range of 30 to 70 degrees is sufficiently low.

Thus, according to the present embodiment, the light output efficiency can be significantly improved by setting the angle α made by the base and the side of each protrusion to between 30 and 70 degrees, not by simply making the light output surface rough.

When the pitch or period of the protrusions 20 formed on the light output side is made extremely small, the effect of increasing the light output efficiency is reduced. According to our experiments, satisfactory effects were confirmed when the pitch of the protrusions was 0.5 μm or more. The current block layer 21 and the GaAs layer 22 on the transparent electrode 17 are not necessarily required. Even when the metal electrode 23 was directly formed on the transparent electrode 17, we confirmed similar effects.

[Second Embodiment]

Figure 5:
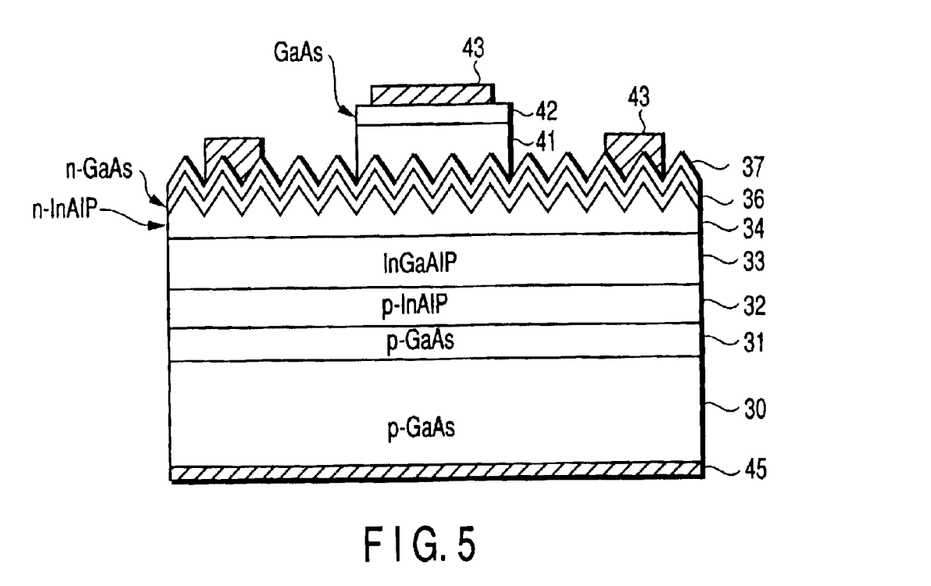
FIG. 5 is a cross-sectional view of a green LED according to a second embodiment of the present invention.

Referring now to FIG. 5, there is illustrated, in sectional view, the structure of a green LED according to a second embodiment of the present invention.

In the second embodiment, each of grown layers is opposite in conductivity type to a corresponding one of the grown layers in the first embodiment and the basic structure and the method of manufacture of the LED remain unchanged from those of the first embodiment.

Onto a p-type GaAs substrate 30 are sequentially grown by means of MOCVD a p-type GaAs buffer layer 31 of 0.5 µm in thickness, a p-type $In_{0.5}Al_{0.5}P$ cladding layer 32 of 0.6 µm in thickness, an undoped InGaAlP active layer 33 of 1.0 µm in thickness, an n-type $In_{0.5}Al_{0.5}P$ cladding layer 34 of 1.0 µm in thickness, and an n-type GaAs contact layer 36 of 0.1 µm in thickness. A transparent ITO film 37 is then formed on the contact layer 36 by means of sputtering techniques.

As in the first embodiment, in growing the n-type InAlP cladding layer 34, the $PH_3$ partial pressure in the MOCVD process is reduced to a sufficiently low pressure (20 Pa or below). Thereby, conical protrusions are produced on the surface of the InAlP cladding layer 34 as in the first embodiment. The angle α of each protrusion with respect to the substrate surface becomes 30 degrees or more.

A current block layer 41 and a GaAs layer 42 are formed on a selected portion of the ITO film 37 and an n-side electrode 43 consisting of AuGe is formed on selected portions of the GaAs layer 42 and the ITO film 37. The GaAs substrate 30 is formed underneath with a p-type electrode 45 made of ZnAu.

With such a structure as described above, the conical protrusions formed on the surface of the n-type InAlP cladding layer 34 allows the probability of incidence of light on the transparent resin for packaging to be increased as in the first embodiment.

[Third Embodiment]

Figure 6A:
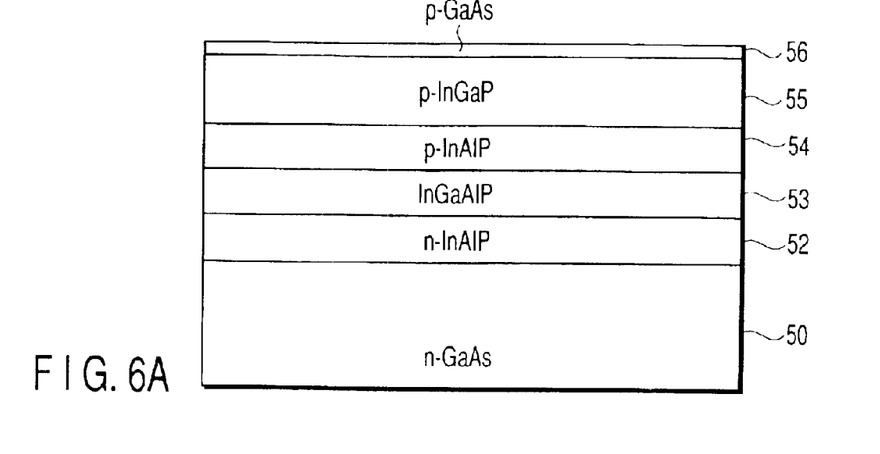
FIGS. 6A and 6B are cross-sectional views, in the order of steps of manufacture, of a green LED according to a third embodiment of the present invention.
Figure 6B:
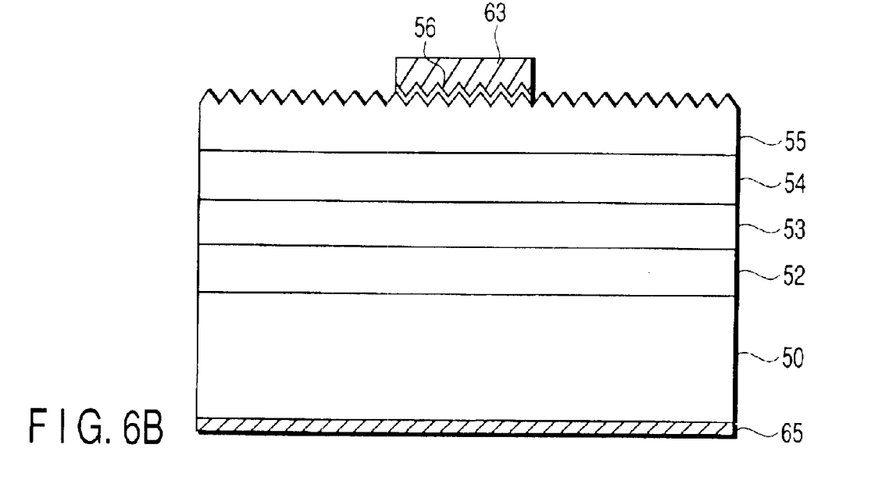

FIGS. 6A and 6B are sectional views, in the order of steps of manufacture, of a green LED according to a third embodiment of the present invention.

First, as shown in FIG. 6A, onto an n-type GaAs substrate 50 of 250 µm in thickness are sequentially grown by means of MOCVD an n-type $In_{0.5}Al_{0.5}P$ cladding layer 12 of 0.6 µm in thickness, an undoped $In_{0.5}(Ga_{0.55}Al_{0.45})_{0.5}P$ active layer 53 of 1.0 µm in thickness, a p-type $In_{0.5}Al_{0.5}P$ cladding layer 54 of 1.0 µm in thickness, an n-type InGaP current diffusing layer 55 of 3.0 µm in thickness, and a p-type GaAs contact layer 56 of 0.1 µm in thickness. For epitaxial growth of these layers, the MOCVD techniques are used as in the first embodiment.

Next, an annealing step is performed at a temperature equal to or higher than the epitaxial temperature (not lower than 600° C.) in order to change the epitaxial surface topography. Thereby, the surface of the current diffusing layer 55 becomes roughened to form protrusions. Afterward, a p-side electrode 63 is formed on the current diffusing layer 55 and an n-side electrode 65 is formed on the back of the substrate 50. Subsequently, the exposed portion of the p-GaAs layer 56 is removed. Thus, the structure shown in FIG. 6B is completed.

Here, the surface roughening by annealing will be described in more detail. As the gases used in the annealing step, an inert gas, such as hydrogen, and a group V element gas (for example, $AsH_3$) different from group V elements (for example, p) constituting the epitaxial films (III-V compound materials, for example, InGaAlP) are introduced. The group V element (P) in the epitaxial surface layer is reevaporated. Further, as the next step, an epitaxial step is performed on the roughened surface (the type of film: a transparent film of, say, GaP).

Figure 7:
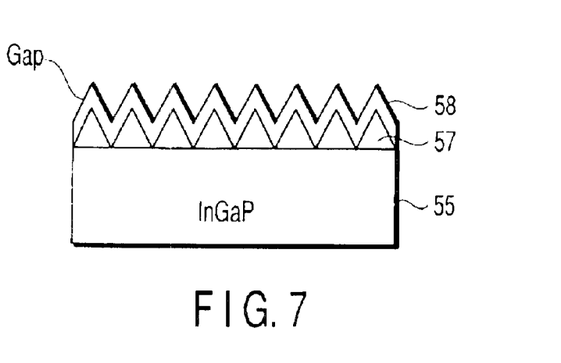
FIG. 7 is an enlarged cross-sectional view of the neighborhood of the light output surface in the third embodiment.

Thus, P is extracted from the surface of the InGaP current diffusing layer 55, so that the surface becomes roughened as shown in FIG. 7. A transparent GaP layer 57 is then grown on the rough surface of the InGaP layer 56. The desired surface topography for increasing the light output efficiency is one in which a large number of convex conical protrusions are formed over the surface, which is obtained from a conventional epitaxial surface in a state of mirror surface (Rmax=5 nm). The angle of each conical protrusion with respect to the base is larger than 30 degrees.

With such a structure as well, the conical protrusions formed on the surface of the current diffusing layer 55 allows the probability of incidence of light on the transparent resin for packaging to be increased as in the first embodiment.

The p-type GaAs contact layer 56 need not necessarily be removed; however, if it absorbs light of the emitted wavelength, it should preferably be removed.

[Fourth Embodiment]

Figure 8:
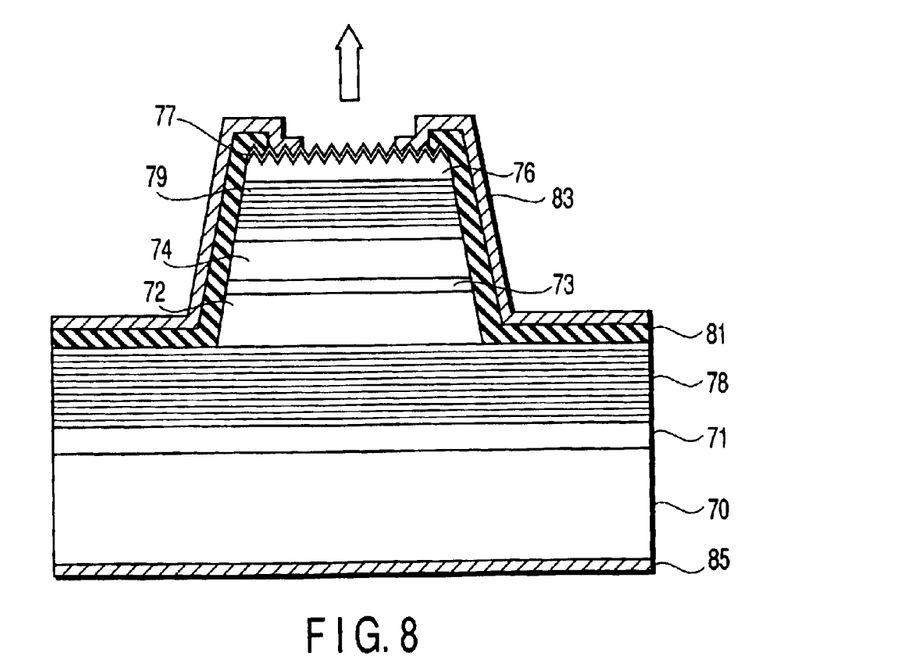
FIG. 8 is a cross-sectional view of a surface-emitting LD according to a third embodiment of the present invention.

In FIG. 8, there is illustrated, in sectional view, the structure of a surface-emitting LD according to a fourth embodiment of the present invention.

First, on an n-type GaAs substrate 70 of 250 µm in thickness are sequentially grown an n-type GaAs buffer layer 71 of 0.5 µm in thickness and a DBR reflecting layer 78 consisting of stacked $n-In_{0.5}Al_{0.5}P$/n-GaAs films.

Subsequently, an n-type $In_{0.5}Al_{0.5}P$ cladding layer 72 of 0.6 µm in thickness, an undoped MQW active layer 73 of $In_{0.5}(Ga_{0.55}Al_{0.45})_{0.5}P/In_{0.5}Ga_{0.5}P$, and a p-type $In_{0.5}Al_{0.5}P$ cladding layer 74 of 0.6 µm in thickness are grown in sequence, thus forming a double heterostructure. Subsequently, a DBR reflecting layer 79 consisting of stacked $p-In_{0.5}Al_{0.5}P$/p-GaAs films, a p-type $In_{0.5}Al_{0.5}P$ current diffusing layer 76 of 1.0 µm in thickness and a p-type GaAs contact layer 77 of 0.1 µm in thickness are grown in sequence.

Each of the epitaxial layers from the buffer layer 71 to the contact layer 77 is grown in succession in the same chamber through the use of MOCVD techniques. The type of gas used and the pressure thereof are selected so that each layer is grown well. In growing the current diffusing layer 76, as in the first embodiment, the $PH_3$ partial pressure is reduced to a sufficiently low value of, for example, 10 Pa so as to allow the layer surface to become roughened.

Next, a resist pattern is formed on the contact layer 77 and the layers through the n-type cladding layer 72 are then etched away using the resist pattern as a mask to thereby form a laser ridge. Subsequently, an insulating film 81 is formed except the top of the ridge and then a p-type electrode (Zn-containing Au) is evaporated. Using a resist mask, a portion of the p-type electrode which is located in the central portion of the ridge and the p-GaAs contact layer 77 underlying that portion of the p-type electrode are removed, thereby forming an upper electrode 83. Subsequently, the GaAs substrate 70, after having its rear side polished to a thickness of 100 µm, is formed underneath with an n-side electrode (Ge-containing Au) 85. Next, a heat treatment is carried out in an Ar atmosphere at 450° C. for 15 minutes. Subsequently, the substrate 70 is scribed to obtain chips. Each individual chip is then housed in a resin package.

According to the fourth embodiment thus configured, reducing the $PH_3$ partial pressure at the growth of the p-type current diffusing layer 76 allows protrusions (irregularities) to be formed on the surface of that current diffusing layer and the angle between the surface of the resulting conical protrusions and the base to be made larger than 30 degrees. In the fourth embodiment, as in the first embodiment, the light output efficiency can therefore be increased. Although the laser diode of the fourth embodiment is adapted to emit red light, this is not restrictive. We confirmed the above effects for other laser diodes than red diodes.

The p-type GaAs contact layer 77 need not necessarily be removed; however, if it absorbs light of the emitted wavelength, it should preferably be removed.

[Fifth Embodiment]

Figure 9A:
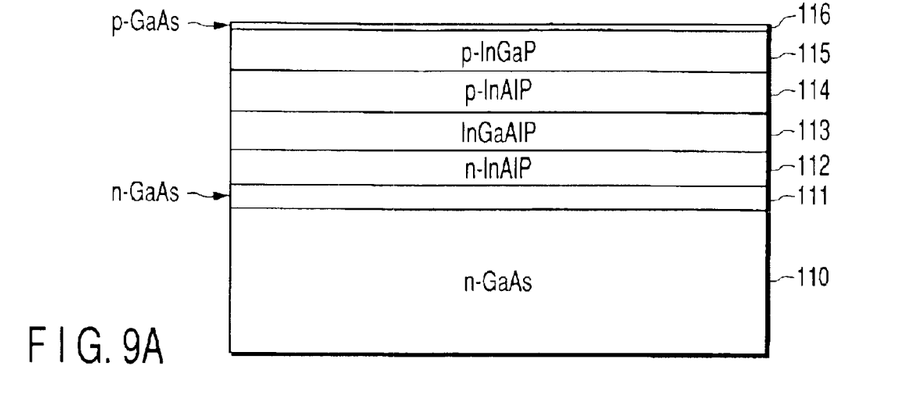
FIGS. 9A, 9B and 9C are cross-sectional views, in the order of steps of manufacture, of a green LED according to a fifth embodiment of the present invention.
Figure 9B:
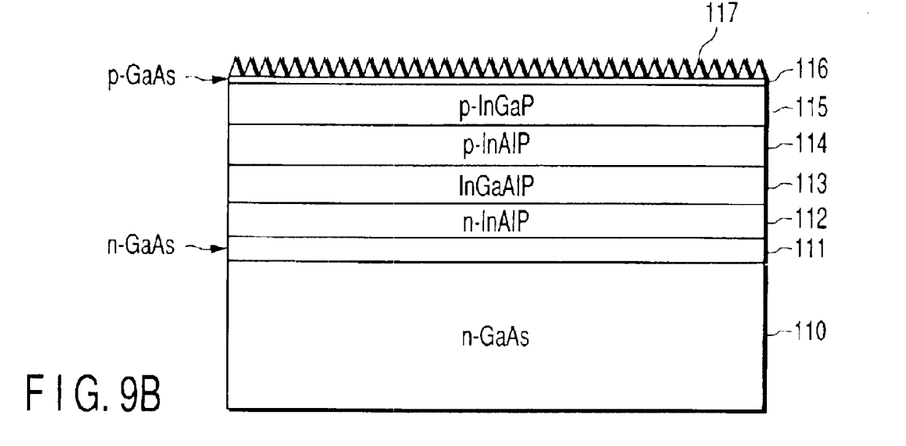
Figure 9C:
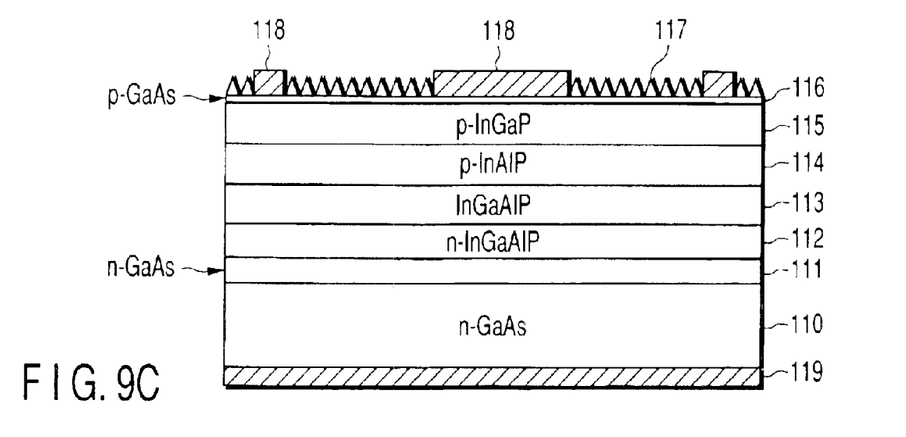

FIGS. 9A, 9B and 9C are sectional views, in the order of steps of manufacture, of a green LED according to a fifth embodiment of the present invention.

First, as shown in FIG. 9A, onto an n-type GaAs substrate 110 of 250 μm in thickness, an n-type GaAs buffer layer 11 of 0.5 μm in thickness is grown by means of MOCVD using $AsH_3$ as a group V element source gas. After that, by means of MOCVD using $PH_3$ as aV group element source gas and under conditions of a $PH_3$ partial pressure of 200 Pa and a total pressure of $5 \times 10^3$ Pa, an n-type $In_{0.5}Al_{0.5}P$ cladding layer 112 of 0.6 μm in thickness, an undoped InGaAlP active layer 113 of 1.0 μm in thickness, a p-type $In_{0.5}Al_{0.5}P$ cladding layer 114 of 1.0 μm in thickness and a p-type InGaP current diffusing layer 115 of 1.0 μm in thickness are grown in sequence. Subsequently, a p-type GaAs contact layer 116 of 0.1 μm in thickness is grown by means of MOCVD using $AsH_3$ as a group V element source gas. Each of the epitaxial layers from the buffer layer 111 to the contact layer 116 is grown in succession in the same chamber.

Next, as shown in FIG. 9B, an antireflection film 117 is formed, which features this embodiment. That is, the antireflection film 117 having a refractive index of 2.0 and prepared by adding $TiO_2$ to a polyimide resin is formed on the contact layer 116 by spin coating and its surface is then press shaped by a metal mold having protrusions which are less in size than the wavelength of emitted light. Thereby, the surface roughness (PV value (max−min)) of the antireflection film 117 is set to be less than the wavelength of emitted light. Here, the PV value refers to the distance (height) between the peak and the valley of each protrusion.

Next, the antireflection film 117 is formed on top with a resist mask (not shown) and then removed by RIE in the place where an upper electrode is to be formed. The resist mask is then removed. Subsequently, as shown in FIG. 9C, an electrode material (Zn-containing Au) is evaporated onto the antireflection film 117 and the exposed contact layer 116 and then patterned using a resist mask (not shown), thus forming the upper electrode (p-side electrode) 118. The pattern of the p-side electrode 118 remains unchanged from that shown in FIG. 3.

Next, the GaAs substrate 110 has its rear side polished to a thickness of 100 μm and then formed underneath with a lower electrode 119 (Ge-containing Au) serving as the n-side electrode. After that, the resulting structure is subjected to a heat treatment in an Ar atmosphere at 450° C. for 15 minutes. Subsequently, the substrate 110 is scribed to obtain chips. Each individual chip, after wire bonding, is encapsulated with epoxy-based resin (n is about 1.5).

Thus, according to the sixth embodiment, by causing the surface of the antireflection film 117 to become roughened, the light output efficiency was increased from about 20% (the value of the conventional device) to about 30%. That is, the light output efficiency was increased by a factor of 1.15 in comparison with the conventional device. That the light output efficiency can be increased by such an amount without changing the basic device structure is extremely advantageous to LEDs.

Figure 10:
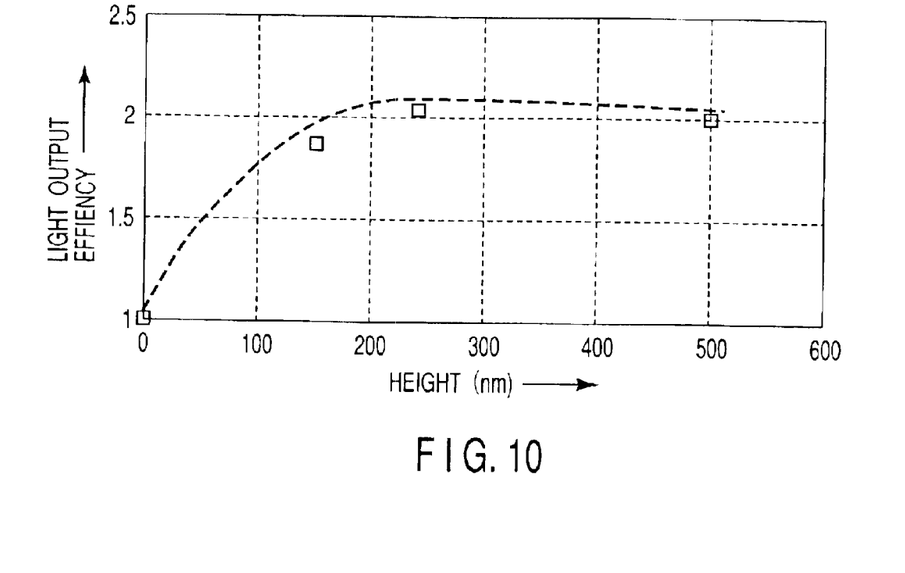
FIG. 10 shows a plot of the light output efficiency versus the height of protrusions in the LED of FIG. 5.
Figure 11:
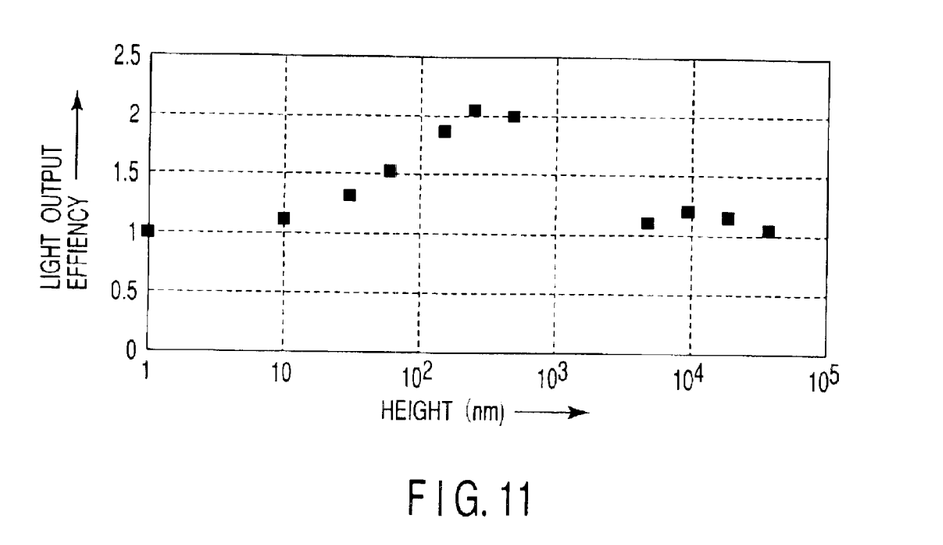
FIG. 11 shows a plot of the light output efficiency versus the height of protrusions comparable in size with the emitted wavelength.

FIG. 10 shows the relationship between the PV value and the light output efficiency. As the PV value increases, the light output efficiency increases. When the PV value exceeds 50 nm, the light output efficiency becomes 1.5 or more. When the PV value exceeds 200 nm, the light output efficiency becomes about 2 and remains almost constant. FIG. 11 shows the relationship between the PV values corresponding to wavelengths including the wavelength of emitted light and the light output efficiency. At PV values corresponding to wavelengths shorter than 640 nm, the emitted wavelength, a sufficient light output efficiency is obtained. However, when the PV value increases above the value corresponding to the emitted wavelength, the light output efficiency decreases sharply. Therefore, the PV value should preferably be ranged from 200 nm to less than a value corresponding to the emitted wavelength.

Note that all the protrusions and recesses need not necessarily meet the requirement that the PV value be ranged from 200 nm to a value corresponding to the emitted wavelength and most of them (for example, not less than 90%) have only to meet the requirement. That is, even if the protrusions and recesses are formed so as to satisfy the requirement that 200 nm≦PV≦emitted wavelength, some of them may be outside the range. If the percentage of such protrusions and recesses is low enough, no problem will arise.

Figure 12:
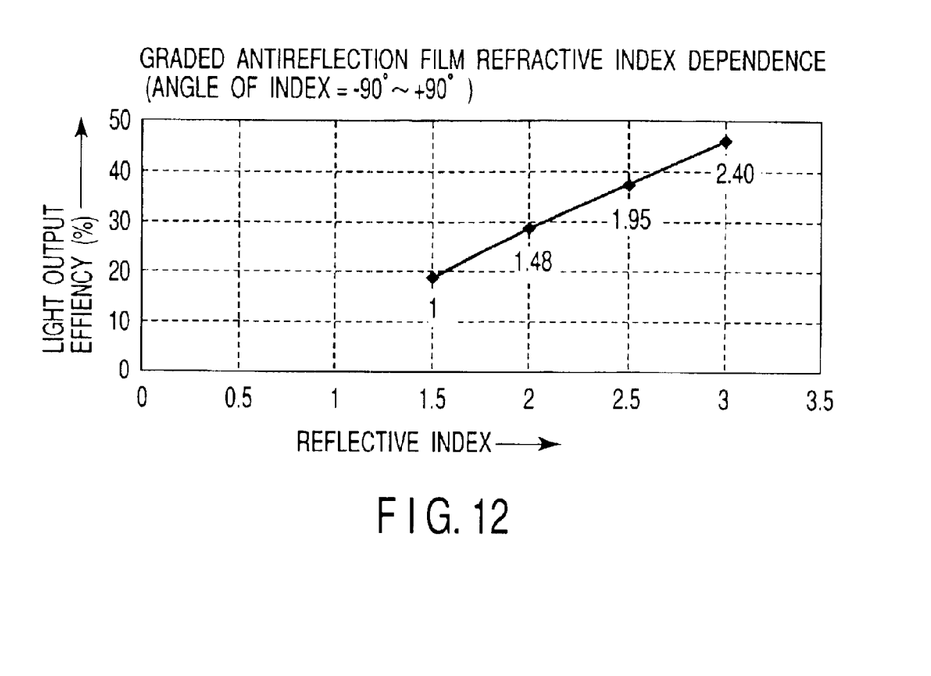
FIG. 12 shows a plot of the light output efficiency versus the refractive index when the surface of the antireflection film is roughened.

FIG. 12 shows the relationship between the light output efficiency and the refractive index when the surface of the antireflection film is made rough. This indicates the percentage of light that is output from a surface of the antireflection film when light falls on the other surface of that film at an angle of incidence of −90 to +90 degrees. From FIG. 12 it can be seen that, when reference is made to the light output efficiency at a refractive index of 1.5 (the same as that of the underlying semiconductor layer), the light output efficiency is increased by about 50% at a refractive index of 2.0 (this embodiment) and by about 100% at a refractive index of 2.5.

Figure 13:
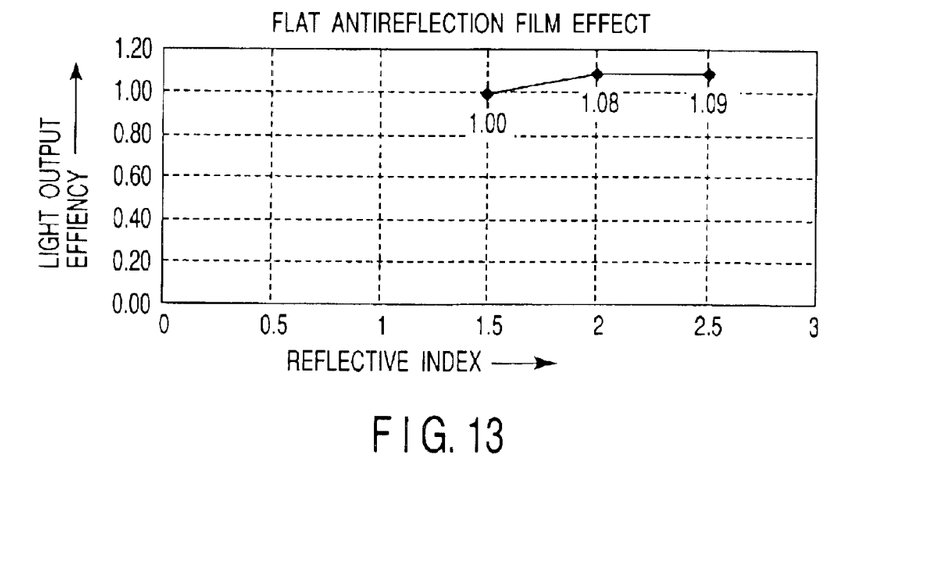
FIG. 13 shows a plot of the light output efficiency versus the refractive index when the surface of the antireflection film is made smooth.
Figure 14A:
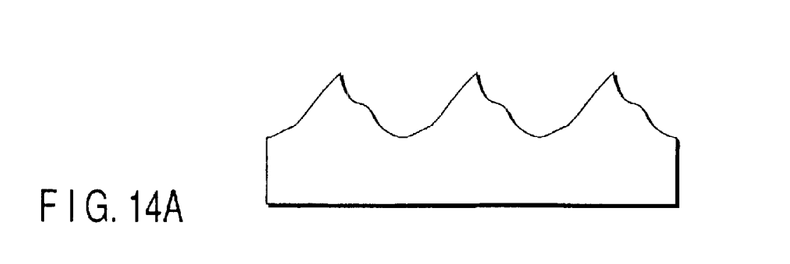
FIGS. 14A to 14E are sectional views illustrating various surface configurations of the antireflection film which may be used in the invention.
Figure 14B:
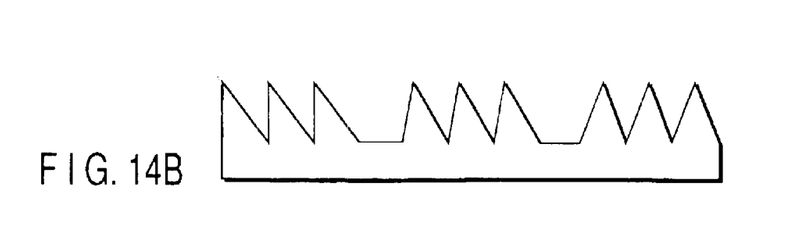
Figure 14C:
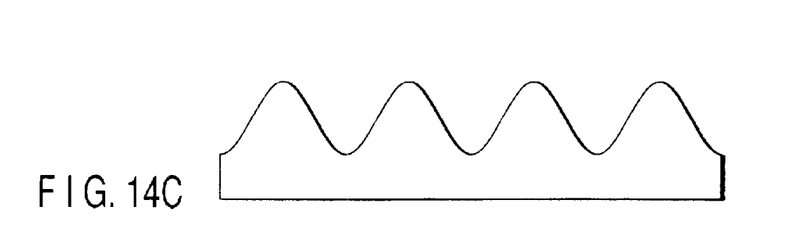
Figure 14D:
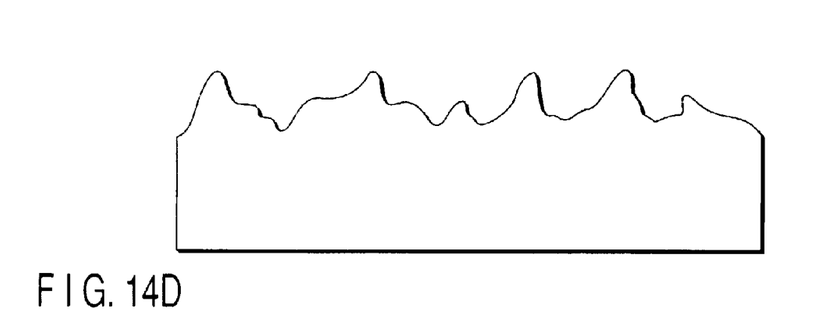
Figure 14E:
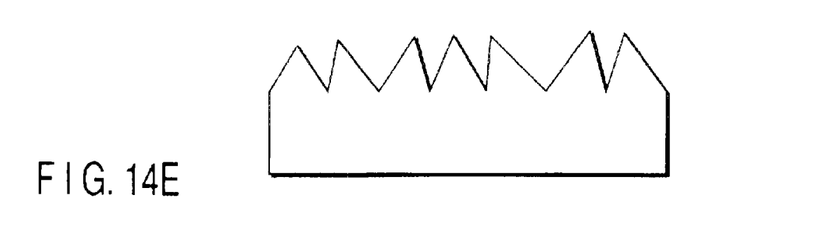

FIG. 13 shows the relationship between the light output efficiency and the refractive index when the surface of the antireflection film is smoothed. In this case, the light output efficiency is increased by 8% at a refractive index of 2.0. Even at a refractive index of 2.5, an increase in the light output efficiency is as low as 9%. From this it can bee seen that, in order to increase the light output efficiency, it is necessary not only to increase the refractive index of the antireflection film but also to make its surface rough.

Our experiments confirmed that the light output efficiency was increased sufficiently by setting the surface roughness (PV value (max−min)) of the antireflection film to emitted wavelength λ or less. Further, our experiments confirmed that, as the surface topology of the antireflection film, the formation of cones or polygonal pyramids (triangular pyramids, rectangular pyramids, hexagonal pyramids, etc.) at a pitch of 0.5 λ or less offered more successful results.

Thus, according to this embodiment, the probability of incident light suffering total internal reflections at the interface between the top layer of the semiconductor multilayer structure including a light emitting layer and the transparent resin can be reduced by forming an antireflection film whose surface is rough on the light output side of the semiconductor multilayer structure. Also, it becomes possible to increase the light output efficiency significantly by setting the surface roughness of the antireflection film to the emitted wavelength or less. In addition, by setting the refractive index of the antireflection film between that of the transparent resin used for device packaging and that of the top layer of the semiconductor multilayer structure, the effect of increasing the light output efficiency can be enhanced further.

Here, in the conventional device, the semiconductor multilayer structure has a refractive index of about 3.5 and the transparent resin for plastic encapsulation has a refractive index of about 1.5 and hence there is a large difference in refractive index between them. In this case, the critical angle associated with total reflection of light traveling from the semiconductor multilayer structure to the transparent resin is small. In this embodiment, the critical angle associated with total reflection can be made large by interposing between the semiconductor multilayer structure and the transparent resin an antireflection film whose refractive index (1.5 to 3.5) is intermediate between their refractive indices. Thereby, the light output efficiency can be increased. Moreover, the light output efficiency can be further increased by making the antireflection film surface rough.

The emitted wavelength of the LED is not restricted to the wavelength of green light. The above effects were also confirmed by products adapted for visible light other than green light. Concerning the shape of protrusions and recesses (irregularities) of the antireflection film which are of the size of less than the emitted wavelength, we confirmed that any of surface configurations shown in FIGS. 14A to 14E allowed the light output efficiency to be increased.

Besides InGaAlP, an InGaAlAs-based material, an AlGaAs-based material or a GaP-based material may be used as the LED material. Further, to prepare the antireflection film, $TiO_2$, $TaO_2$ or $ZrO_2$ may be added to acrylic resin.

[Sixth Embodiment]

Figure 15:
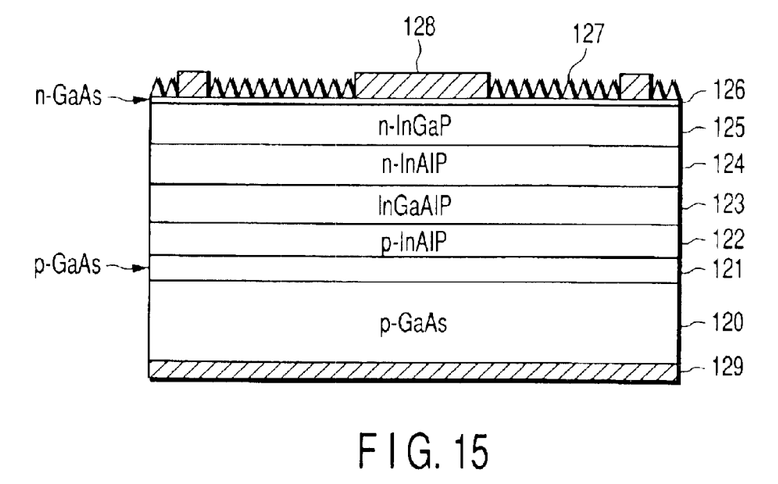
FIG. 15 is a cross-sectional view of a green LED according to a sixth embodiment of the present invention.

FIG. 15 is a sectional view of a green LED according to a sixth embodiment of the present invention.

In this embodiment, the conductivity type of each semiconductor layer is made opposite to that of the corresponding semiconductor layer in the fifth embodiment. The method of manufacture is substantially the same as in the fifth embodiment. That is, onto a p-type GaAs substrate 120 of 250 μm in thickness, a p-type GaAs buffer layer 121 of 0.5 μm in thickness, a p-type $In_{0.5}Al_{0.5}P$ cladding layer 122 of 0.6 μm in thickness, an undoped $In_{0.5}(Ga_{0.55}Al_{0.45})_{0.5}P$ active layer 123 of 1.0 μm in thickness, an n-type $In_{0.5}Al_{0.5}P$ cladding layer 124 of 1.0 μm in thickness, an n-type InGaP current diffusing layer 125 of 1.0 μm in thickness and an n-type GaAs contact layer 126 of 0.1 μm in thickness are grown in the same chamber.

As in the fifth embodiment, an antireflection film 127 having a refractive index of 2.0 is formed on the contact layer 126 by spin coating and then subjected to press shaping using a metal mold so that its surface becomes roughened. A portion of the antireflection film 127 is removed in the place where an electrode is to be formed and an upper electrode (n-side electrode) 128 is formed on the exposed portion of the contact layer 126. The GaAs substrate 120 is formed underneath with a lower electrode (p-side electrode) 129. The resulting wafer is scribed to obtain chips. Each chip is encapsulated with resin material after having been subjected to a wire bonding step.

Even with such a structure, the light output efficiency was increased by a factor of about 2.5 as in the sixth embodiment. The same effects were also confirmed by products adapted for visible light other than green light. Further, we confirmed that any of the surface configurations shown in FIGS. 14A to 14E allowed the light output efficiency to be increased.

[Seventh Embodiment]

Figure 16:
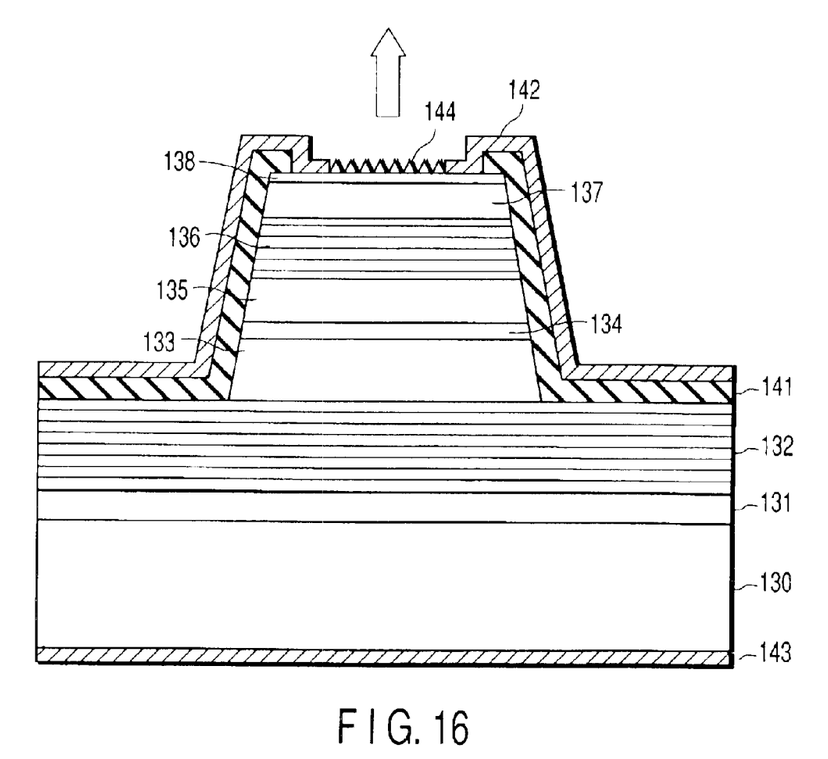
FIG. 16 is a cross-sectional view of a surface-emitting LD according to a seventh embodiment of the present invention.

In FIG. 8, there is illustrated, in sectional view, the structure of a surface-emitting LD according to a seventh embodiment of the present invention.

First, on an n-type GaAs substrate 130 of 250 μm in thickness are sequentially grown an n-type GaAs buffer layer 131 of 0.5 μm in thickness and a multilayer reflecting layer 132 consisting of stacked n-$In_{0.5}Al_{0.5}P$/n-GaAs films. Subsequently, an n-type $In_{0.5}Al_{0.5}P$ cladding layer 133 of 0.6 μm in thickness, an undoped MQW active layer 134 of $In_{0.5}(Ga_{0.55}Al_{0.45})_{0.5}P$/$In_{0.5}Ga_{0.5}P$, and a p-type $In_{0.5}Al_{0.5}P$ cladding layer 135 of 0.6 μm in thickness are grown in sequence. Subsequently, a multilayer reflecting layer 136 consisting of stacked p-$In_{0.5}Al_{0.5}P$/p-GaAs films, a p-type $In_{0.5}Al_{0.5}P$ current diffusing layer 137 of 1.0 μm in thickness and a p-type GaAs contact layer 138 of 0.1 μm in thickness are grown in sequence. The epitaxial layers from the buffer layer 131 to the contact layer 138 are grown in the same chamber.

Next, a resist mask in the form of a stripe is formed on the contact layer 138. After that, the layers through the n-type cladding layer 133 are then etched away using the resist mask to thereby form a laser ridge. Subsequently, an $SiO_2$ insulating film 141 of 0.5 μm is formed except the top of the ridge and then a p-type electrode (Zn-containing Au) is evaporated. Using a resist mask, an upper electrode 142 is then formed. The upper electrode 142 comes into contact with the peripheral portion of the contact layer 138 and the central portion of the contact layer is exposed.

Next, an antireflection film 144 having a refractive index of 2.0 and prepared by adding $TiO_2$ to polyimide resin is formed on the contact layer 116 by spin coating and its surface is then press shaped by a metal mold having protrusions which are less in size than the wavelength of emitted light. Thereby, the surface roughness (PV value (max–min)) of the antireflection film 117 is made smaller than the wavelength of emitted light. Afterward, the unnecessary portion of the antireflection film 144 is removed.

Next, the GaAs substrate 130 has its rear side polished to a thickness of 100 μm and then formed underneath with an n-side electrode (Ge-containing Au) 143. After that, the resulting structure is subjected to a heat treatment at 450° C. for 15 minutes in an Ar atmosphere. Subsequently, the resulting wafer is scribed to obtain chips. Each individual chip is assembled and housed in a package made of epoxy-based resin (n is about 1.5).

In this embodiment, as in the fifth embodiment, the light output efficiency can be increased significantly by forming the antireflection film 144 which is intermediate in refractive index between the underlying semiconductor layers and the sealing resin and has its surface made rough. Concerning the surface topology of the antireflection film, we confirmed that any of surface configurations shown in FIGS. 14A to 14E allowed the light output efficiency to be increased as in the fifth embodiment.

Besides InGaAlP, an InGaAlAs-based material, an AlGaAs-based material or a GaP-based material may be used as the semiconductor material. Further, to prepare the antireflection film, $TiO_2$, $TaO_2$ or $ZrO_2$ may be added to acrylic resin.

[Modifications]

The present invention is not restricted to the embodiments described so far. Although, in the first and fourth embodiments, the $PH_3$ partial pressure is set at 10 Pa to make the crystal surface rough, it may lie in the range of 1 to 20 Pa. In the third embodiment, to make the crystal surface rough, annealing is performed with $AsH_3$ introduced. The gas used on annealing is not restricted to $AsH_3$. Any other gas may be used provided that it contains hydrogen and a group V element different from a group V element that constitutes the semiconductor layer whose surface is to be roughened. The method of making the crystal surface rough is not restricted to reducing the $PH_3$ partial pressure and annealing after crystal growth. It is also possible to process randomly the surface of the semiconductor layer with a grinder having a point angle of less than 120 degrees.

The protrusions need not be restricted to circular cones but may be pyramidal ones, such as triangular pyramids, square pyramids, hexagonal pyramids, etc. The protrusions need not necessarily be formed over the entire surface on the light output side. However, it is desired that the percentage of the area occupied by the protrusions on the light output surface be as large as possible. If the percentage is 50% or more, a satisfactory result will be obtained.

The light output efficiency is proportional to the occupied area; thus, if the occupied area by protrusions is 50% or less, the light output efficiency will be halved (1.1 times or less). If the pitch of the protrusions is in a range of 0.2 to 0.5 $\mu$m, the light output efficiency is reduced (1.1 times or less). if the pitch is less than 0.2 $\mu$m, the graded index effect will occur.

In the fifth, sixth and eighth embodiments, a metal mold having protrusions and recesses is used to make the surface of the antireflection film rough; instead, it is also possible to roughen the surface of an antireflection film already formed with a grinder. In this case, various materials other than resin can be used for the antireflection film.

The requirement that the surface roughness (PV value) be ranged from 200 nm to emitted wavelength is not necessarily applied to the antireflection film alone. The requirement may be applied to any other layer on the light output side of the semiconductor multilayer structure. Specifically, the requirement may be applied to the current diffusing layer or the contact layer. That is, in the first through fourth embodiments, the surface roughness (PV value) of the roughened surface may be set to emitted wavelength or less. Further, the requirement that the surface roughness (PV value) be the emitted wavelength or less and the requirement that a be 30 degrees or more may both be satisfied.

If current can be diffused sufficiently to regions other than just below the upper electrode between the upper electrode and the active layer, the current diffusing layer is not necessarily required; it may be omitted. The materials, compositions and thickness of semiconductor layers forming a light emitting device may be changed according to specifications.

Although the embodiments have been described taking transparent resin-based encapsulation by way of example, this is not restrictive. In the case of no resin-based encapsulation, it is air that comes directly into contact with the antireflection film. In this case as well, since there is a large difference in refractive index between the semiconductor multilayer structure and air, the effect of increasing the light output efficiency resulting from the formation of the antireflection film could be expected likewise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface-emitting semiconductor light emitting device comprising:
    a substrate having a major surface; and
    a semiconductor multilayer structure formed on the major surface of the substrate and including a light emitting layer, visible light being output from the opposite surface of the semiconductor multilayer structure and the light output surface having been subjected to a roughening process so that a large number of protrusions and recesses is formed thereon, said protrusions and recesses defining peaks and valleys and a height between the maximum peak and the lowest valley being between 50 nm and a wavelength of visible light emitted by the light emitting layer, wherein the protrusions and recesses are formed periodically with a period set to 0.5 $\lambda$ or less, where $\lambda$ is the wavelength of the emitted visible light.

2. The device according to claim 1, wherein the semiconductor multilayer structure has a double heterostructure in which an active layer is sandwiched between cladding layers, a transparent electrode is formed on the opposite cladding layer of the double heterostructure from the substrate, and a surface of the cladding layer immediately under the transparent electrode has been subjected to the roughening process.

3. The device according to claim 2, wherein the active layer is made of InGaAlP and the cladding layers are each made of InAlP.

4. The device according to claim 1, wherein the semiconductor multilayer structure has a double heterostructure in which, an active layer is sandwiched between cladding layers, a current diffusing layer is formed on the opposite cladding layer of the double heterostructure from the substrate, and the surface of the current diffusing layer has been subjected to the roughening process.

5. The device according to claim 1, wherein the protrusions and recesses are formed at a regular interval and a pitch of the protrusions is within a range in which a graded index effect is ensured.

6. The device according to claim 1, wherein the protrusions and recesses are formed at a regular interval and a pitch of the protrusions is set to 0.2 $\mu$m or less.

7. A surface-emitting semiconductor light emitting device comprising:
    a substrate having a major surface;
    a semiconductor multilayer structure formed on the major surface of the substrate and including a light emitting layer, visible light being output from the opposite surface of the multilayer structure from the substrate; and
    an antireflection film formed on the light output surface of the semiconductor multilayer structure and having its surface roughened so that a large number of protrusions and recesses is formed thereon, said protrusions and recesses defining peaks and valleys and a height between the maximum peak and the lowest valley being between 50 nm and a wavelength of visible light emitted by the light emitting layer, wherein the protrusions and recesses are formed periodically with a period set to 0.5 $\lambda$ or less, where $\lambda$ is the wavelength of the emitted visible light.

8. The device according to claim 7, wherein a refractive index of the antireflection film is set higher than that of a transparent resin which is applied to the light output surface of the semiconductor multilayer structure but lower than that of a top layer of the semiconductor multilayer structure.

9. The device according to claim 7, wherein the semiconductor multilayer structure has a double heterostructure in which an active layer is sandwiched between cladding layers and a current diffusing layer is formed on the opposite cladding layer of the double heterostructure from the substrate.

10. The device according to claim 9, wherein the active layer is made of InGaAlP and the cladding layers are each made of InAlP.

11. The device according to claim 7, wherein the protrusions and recesses are formed at a regular interval and a pitch of the protrusions is within a range in which a graded index effect is ensured.

12. The device according to claim 7, wherein the protrusions and recesses are formed at a regular interval and a pitch of the protrusions is set to 0.2 μm or less.

13. A surface-emitting semiconductor light emitting device comprising:
a substrate having a major surface;
a semiconductor multilayer structure formed on the major surface of the substrate and including a light emitting layer, visible light being output from the opposite surface of the multilayer structure from the substrate;
a first electrode formed in selected areas of the light output surface of the semiconductor multilayer structure;
an antireflection film formed on the light output surface of the semiconductor multilayer structure except the areas of the first electrode and has its surface roughened so that a large number of protrusions and recesses is formed thereon;
a second electrode formed over the entire rear surface of the substrate; and
said protrusions and recesses defining peaks and valleys, and a height between the maximum peak and the lowest valley being between 50 nm and a wavelength of visible light emitted by the light emitting layer, wherein the protrusions and recesses are formed periodically with a period set to 0.5 λ or less, where λ is the wavelength of the emitted visible light.

14. The device according to claim 13, wherein a refractive index of the antireflection film is set higher than that of a transparent resin which is applied to the light output surface of the semiconductor multilayer structure but lower than that of a top layer of the semiconductor multilayer structure.

15. The device according to claim, 13, wherein the semiconductor multilayer structure has a double heterostructure in which an active layer is sandwiched between cladding layers and a current diffusing layer is formed on the opposite cladding layer of the double heterostructure from the substrate.

16. The device according to claim 15, wherein the active layer is made of InGaAlP and the cladding layers are each made of InAlP.

17. The device according to claim 13, wherein the protrusions and recesses are formed at a regular interval and a pitch of the protrusions is within a range in which a graded index effect is ensured.

18. The device according to claim 13, wherein the protrusions and recesses are formed at a regular interval and a pitch of the protrusions is set to 0.2 μm or less.

19. A surface-emitting semiconductor light emitting device comprising:
a substrate made of a compound semiconductor of a first conductivity type;
a double heterostructure formed on the substrate and comprising a cladding layer of the first conductivity type, an active layer, and a cladding layer of a second conductivity type;
a current diffusing layer of the second conductivity type formed on the cladding layer of the second conductivity type.of the double heterostructure;
a contact layer of the second conductivity type formed on the current diffusing layer;
an upper electrode selectively formed on the contact layer;
a lower electrode formed on the rear surface of the substrate; and
an antireflection film formed on the contact layer except its portions where the upper electrode is formed,
the antireflection film having its surface roughened so that a large number of neighboring protrusions and recesses is formed thereon, said protrusions and recesses defining peaks and valleys, and a height between the maximum peak and the lowest valley being between 50 nm and a wavelength of visible light emitted by the light emitting layer, and
the protrusions and recesses are formed periodically with a period set to 0.5 λ or less, where λ is the wavelength of the emitted visible.

20. The device according to claim 19, wherein the protrusions and recesses are formed at a regular interval and a pitch of the protrusions is within a range in which a graded index effect is ensured.

21. The device according to claim the protrusions and recesses are formed at a regular interval and a pitch of the protrusions is set to 0.2 μm or less.

* * * * *